United States Patent [19]

Liang

[11] Patent Number: 5,792,702
[45] Date of Patent: Aug. 11, 1998

[54] METHOD FOR FORMING A FILM OVER A SPIN-ON-GLASS LAYER BY MEANS OF PLASMA-ENHANCED CHEMICAL-VAPOR DEPOSITION

[75] Inventor: Jack Liang, Hsinchu, Taiwan

[73] Assignee: Winbond Electronics Corp., Taiwan

[21] Appl. No.: 770,170

[22] Filed: Dec. 19, 1996

[30] Foreign Application Priority Data

Oct. 2, 1996 [TW] Taiwan ................. 85112045

[51] Int. Cl.$^6$ ................................................. H01L 21/316
[52] U.S. Cl. ........................ 438/624; 438/781; 438/782
[58] Field of Search ........................... 437/238, 228; 438/787, 781, 782, 624

[56] References Cited

U.S. PATENT DOCUMENTS

| 5,231,057 | 7/1993 | Doki et al. | 437/225 |
| 5,270,267 | 12/1993 | Oullet | 437/231 |
| 5,403,780 | 4/1995 | Jain et al. | 437/195 |
| 5,413,963 | 5/1995 | Yen et al. | 437/195 |
| 5,441,765 | 8/1995 | Ballance et al. | 438/781 |
| 5,459,105 | 10/1995 | Matsuura | 437/228 |
| 5,518,959 | 5/1996 | Jang et al. | 437/190 |
| 5,567,658 | 10/1996 | Wang et al. | 438/697 |
| 5,601,664 | 2/1997 | Kosa et al. | 148/325 |
| 5,603,075 | 2/1997 | Stoll et al. | 428/552 |

OTHER PUBLICATIONS

Ito et al., Application of Surface Reformed Thick Spin-on-Glass to MOS Device Planarization, J. Electrochem. Soc., 137:1212–1218, Apr. 1990.
Matsuura et al., An Advanced Interlayer Dielectric System with Partially Converted Organic SOG by Using Plasma Treatment, VMIC Conference, 113–115, 1993.
Wang et al., A Study of Plasma Treatments On Siloxane SOG, VMIC Conference, 1994.

Primary Examiner—Charles L. Bowers, Jr.
Assistant Examiner—Matthew Whipple
Attorney, Agent, or Firm—Fish & Richardson P.C.

[57] ABSTRACT

A method for forming an oxide film over a spin-on-glass (SOG) layer by a plasma-enhanced chemical-vapor deposition (PECVD) is disclosed. The SOG layer is pre-processed in a forming gas of hydrogen and nitrogen in a PECVD chamber. Then the oxide film is formed over the SOG layer by means of the PECVD process in the PECVD chamber.

10 Claims, 3 Drawing Sheets

METHOD FOR FORMING A FILM OVER A SPIN-ON-GLASS LAYER BY MEANS OF PLASMA-ENHANCED CHEMICAL-VAPOR DEPOSITION

BACKGROUND OF THE INVENTION

1. Field of the Invention

The present invention relates to the fabrication of a semiconductor integrated circuit, and more specifically, to a method for forming a film over a spin-on-glass (SOG) layer by means of a plasma-enhanced chemical-vapor deposition (PECVD) method.

2. Description of Related Art

A multi-metal-layer structure is often utilized to connect different devices in a semiconductor integrated circuit. The multi-metal-layer structure must have dielectric layers, which are known as inter-metal dielectric (IMD) layers, to isolate the various metal layers of the structure. Moreover, planarization of the layers is required to maintain the fabrication consistency of the integrated circuit. Therefore, the inter-metal dielectric technology becomes an important issue in manufacturing semiconductor integrated circuits having multi-metal-layer structures.

In a conventional inter-metal dielectric technology, a first oxide layer is formed over a first metal layer by means of chemical-vapor deposition. Then a spin-on-glass (SOG) layer is formed over the first oxide layer. The SOG layer must be covered by a second oxide layer. After forming contact windows through the second oxide layer, the SOG layer and the first oxide layer, a second metal layer is formed over the second oxide layer and is formed within the contact windows to connect with the first metal layer.

The multi-metal layer structure formed by the aforementioned technology has a cross-sectional view illustrated in FIG. 1. Referring to FIG. 1, an etched pattern of segments 12, 13 of a first metal layer are formed over a semiconductor substrate 10. The first oxide layer 15 then formed over segments 12, 13 and substrate 10. The dielectric layers between the first metal layer and a second metal layer 19 include the first oxide layer 15, a SOG layer 17 and a second oxide layer 18. The second metal layer 19 connects the segments 12, 13 of the first metal layer through the contact windows. Since the SOG material provides a planar surface, the second oxide layer 18 formed over the SOG layer 17 makes the surface more planar, over which the second metal layer 19 can be formed and patterned much easier.

However, moisture and organic content are produced in the SOG material during the manufacturing process of the integrated circuit. The moisture and organic content change the characteristics of the SOG layer and degrade the interfaces between the first oxide layer and the SOG layer, as well as, between the second oxide layer and the SOG layer. Therefore, the structure and performance of the integrated circuit are affected. This problem has been widely studied. For example, see Matsuura et al, An Advanced Interlayer Dielectric System with Partially Converted Organic SOG by Using Plasma Treatment, VMIC Conf., 1993; Wang et al, A Study of Plasma Treatments on Siloxane SOG, VMIC Conf., 1994; and Ito et al, Application of Surface Reformed Thick Spin-on-Glass to MOS Device Planarization, J. Electrochem. Soc., Vol. 137, No. 4, April 1990. According to these articles, when the photoresist layer used in the formation of contact windows is removed by plasma, decomposition of the SOG layer is caused by oxygen plasma, thus generating moisture and organic content.

Some conventional methods to prevent the generation of moisture include heating and plasma treatment. For example, the device is heated in furnace to harden the SOG layer. However, this method interrupts the process flow, and the organic content cannot be removed effectively. Moreover, when the SOG layer is processed by an oxygen plasma, more moisture is absorbed by the SOG layer. When other non-oxygen plasmas, such as $N_2$ or Ar plasma, are utilized to improve the quality of the SOG layer, the device structure may be damaged due to the additional treatment. Since this additional step is not an in-situ process, it is not compatible with the conventional processes.

Certain in-situ treatments to the SOG layer by means of $N_2O$ or $C_2F_2$ plasma have been disclosed. However, these methods cannot effectively remove the organic content generated in the SOG layer.

SUMMARY OF THE INVENTION

Accordingly, the present invention provides a method to remove moisture and organic content generated in an SOG layer during the formation of a thin film over the SOG layer by means of plasma-enhanced chemical-vapor deposition.

In the present invention, the method for forming a film over a semiconductor substrate includes forming a SOG layer over the semiconductor substrate; pre-processing the SOG layer in a forming gas which includes hydrogen and nitrogen; and forming an oxide film over the SOG layer by means of plasma-enhanced chemical-vapor deposition (PECVD) process. Since no organic content is generated from the SOG layer when processed by the hydrogen and nitrogen forming gas, the interface condition between the SOG layer and the oxide film formed by the PECVD method can be improved. Moreover, the pre-processing of the SOG layer by the forming gas can be carried out in the same environment as that of the PECVD process. Because this step is an in situ step, the method of the present invention is completely compatible with a conventional planarization process.

DETAILED DESCRIPTION OF THE INVENTION

Referring to FIG. 2 through FIG. 6, the method of the present invention can be utilized to form an inter-metal dielectric structure on a semiconductor substrate 30. Devices such as transistors, capacitors and diodes can be formed over the substrate 30, but are not shown in the figures; only elements required in the present invention are shown.

Figure 1:
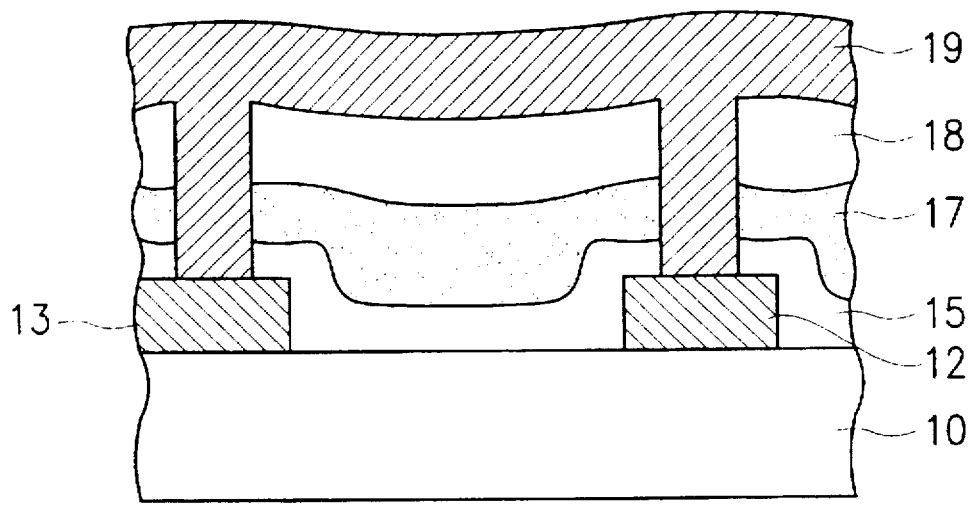
FIG. 1 is a cross-sectional view of a conventional semiconductor device having an inter-metal dielectric structure.
Figure 2:
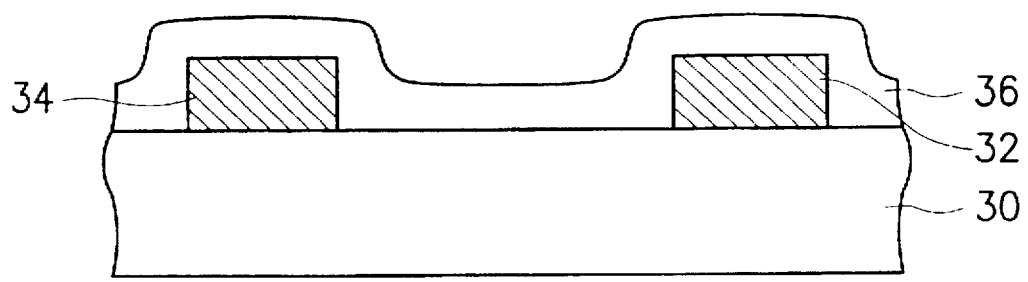
FIG. 2 through FIG. 6 are cross-sectional views illustrating the formation of an inter-metal dielectric structure in a semiconductor device according to the method of the present invention.

Referring to FIG. 2, two segments 32 and 34 of a first metal layer are formed over the semiconductor substrate 30. The first metal layer can be formed by sputtering an aluminum layer over the substrate 30 and then etching back the aluminum layer to have a predetermined pattern including the segments 32 and 34. Since the first metal layer is provided for interconnection of different devices on the substrate 30, there must be dielectric material between the segments 32 and 34 for isolation. Accordingly, a first dielectric layer 36 is formed over the first metal layer. The first dielectric layer 36 can be an oxide layer which can be formed by chemical-vapor deposition, such as a PECVD method.

Figure 3:
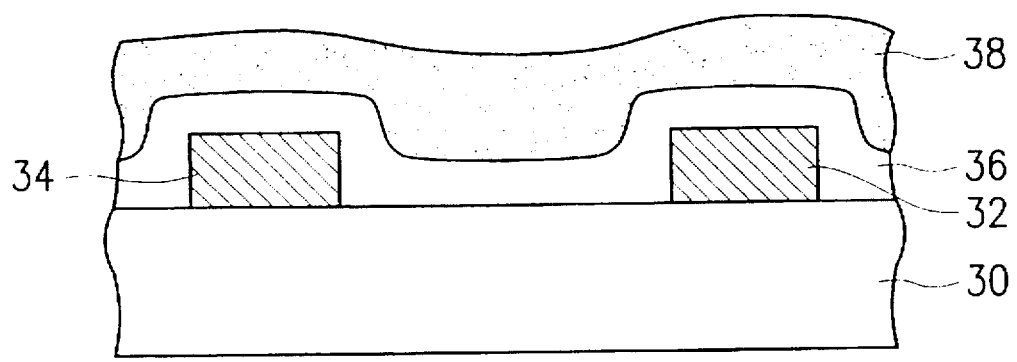

Next, in order to improve the planarization of the device surface and to ensure the isolation of the metal segments 32 and 34, a SOG layer 38 is formed over the first dielectric layer 36. Referring to FIG. 3, the SOG layer 38 can fill the space between the segments 32 and 34 and has a substantially planar surface. The SOG layer can be etched back to increase the surface planarization.

Figure 4:
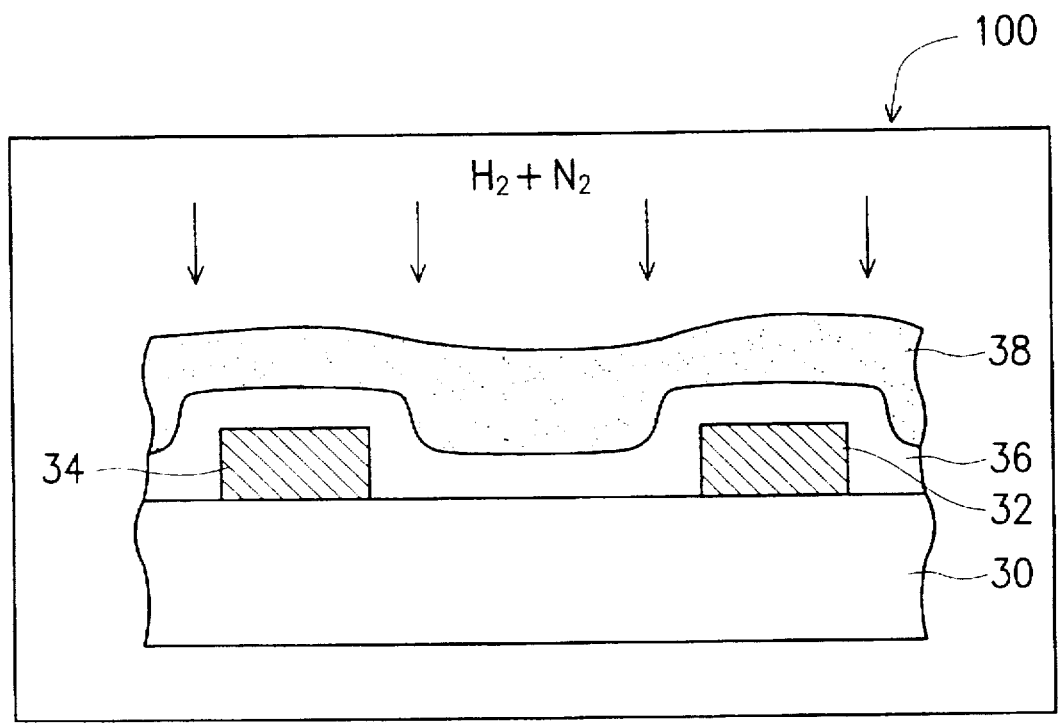

Since a second oxide layer should be formed over the SOG layer 38, as in a conventional IMD process, the SOG layer 38 must be preprocessed to improve the quality of its surface which contacts the second oxide layer. Referring to FIG. 4, the SOG layer 38 is preprocessed by a forming gas of hydrogen and nitrogen. In addition, an organic deficient layer can be formed in the surface region of the SOG layer 38 by means of a conventional thermal method, which can be carried out by heating the SOG layer to a temperature of about 300°–400° C. Then the SOG layer 38 is treated by the forming gas in a PECVD chamber 100. The PECVD chamber 100 is controlled to have a pressure of about 4–6 torr and a temperature of about 300°–400° C. The forming gas, in which the ratio of hydrogen to nitrogen is preferably about 2–10%, is provided at a flow rate of about 500–1500 sccm and analyzed with a power of about 200–400 Watts. The preprocess step is carried out for about 5–15 seconds. During the preprocess step, the organic contents combine with hydrogen and become HCN which is immediately removed by the forming gas flow in the chamber 100. Therefore, the SOG surface is improved.

Figure 5:
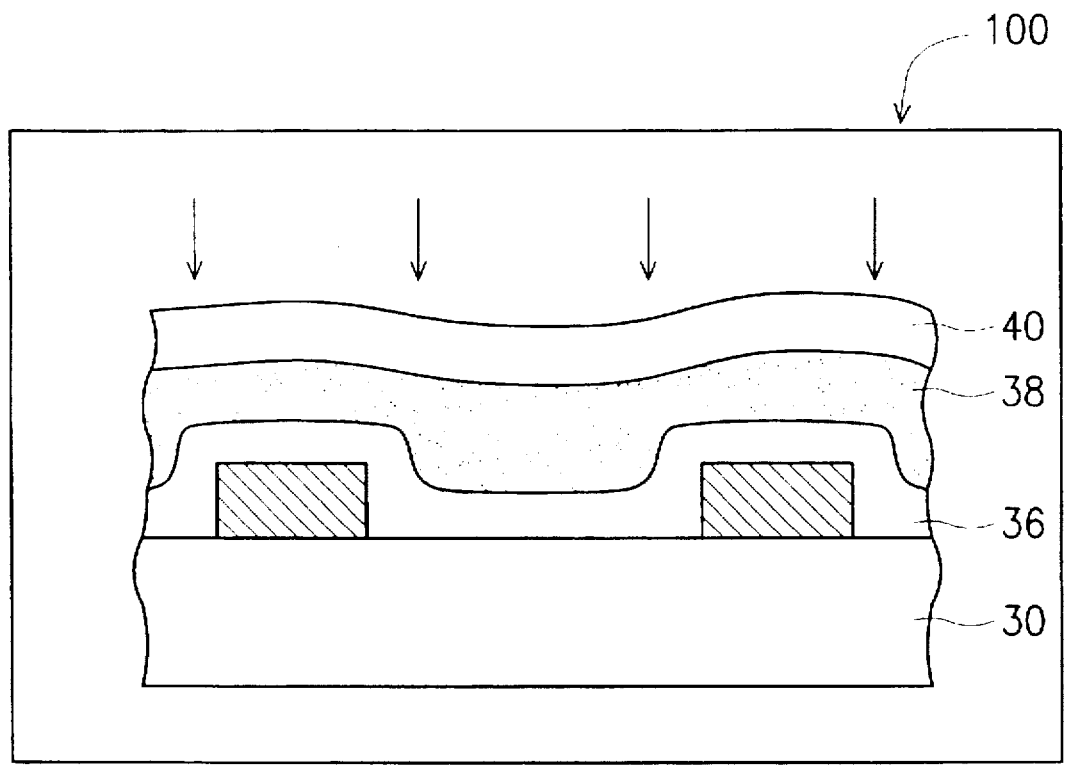

After the preprocess step, the second oxide layer 40 is formed over the SOG layer 38 in the PECVD chamber 100, as illustrated in FIG. 5. The second oxide layer 40 is formed by the PECVD method. Since the preprocessing of the SOG layer 38 and the formation of the second oxide layer 40 are both performed in the chamber 100, damage to the device during transportation can be prevented, and the process conditions can be controlled appropriately. Therefore, the quality of the device can be improved due to its in-situ process.

Figure 6:
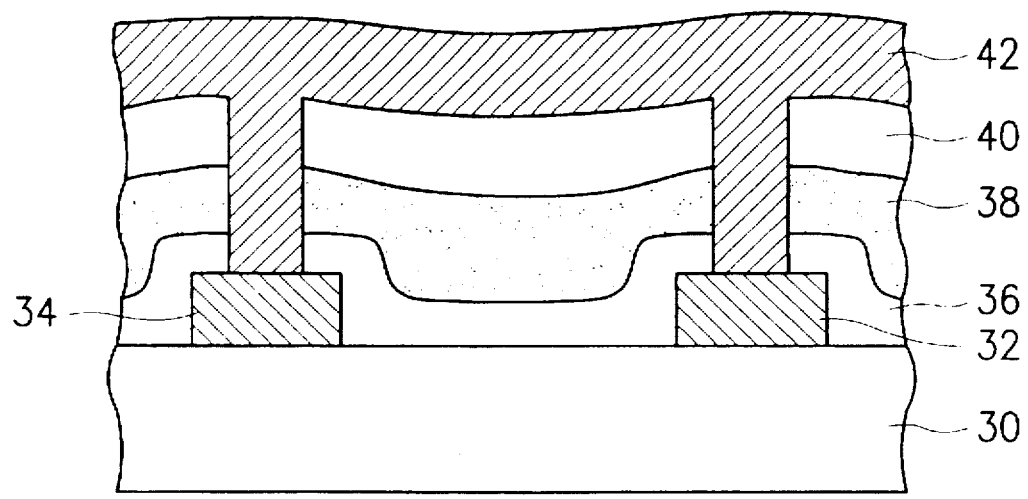

Referring to FIG. 6, contact windows through the second oxide layer 40, the SOG layer 38 and the first dielectric layer 36 can then be formed. Furthermore, a second metal layer 42 is formed over the second oxide layer 40 to contact the first metal layer 32 and 34 through the contact windows.

In the present invention, since any organic content and moisture existing on the surface of SOG layer processed by the hydrogen and nitrogen forming gas is substantially eliminated, the interface condition between the SOG layer and the oxide film formed by the PECVD method is improved. Moreover, the pre-processing step to the SOG layer by the forming gas can be carried out in the same environment as that of the PECVD process. That is, this step is performed in situ, so that the method of the invention, therefore, is completely compatible with conventional planarization processes.

What is claimed is:

1. A method for forming a film over a semiconductor substrate, comprising the steps of:

forming a spin-on-glass layer over said semiconductor substrate;

pre-processing said spin-on-glass layer in a forming gas which includes hydrogen and nitrogen, only so long as is necessary to substantially eliminate impurities on the surface of said spin-on-glass layer; and forming an oxide film over said spin-on-glass layer by means of a plasma-enhanced chemical-vapor deposition (PECVD) process.

2. The method as claimed in claim 1, wherein said oxide layer is formed by means of said plasma-enhanced chemical-vapor deposition (PECVD) process in a PECVD chamber and said spin-on-glass layer is pre-processed by the forming gas in said PECVD chamber.

3. The method as claimed in claim 1, wherein the ratio of hydrogen to nitrogen in said forming gas is about 2–10%.

4. The method as claimed in claim 1 further comprising the step of forming an oxide layer over said semiconductor substrate before the formation of said spin-on-glass layer process.

5. The method as claimed in claim 4 further comprising the step of forming a first metal layer over said semiconductor substrate, said first metal layer covered by said spin-on-glass layer process.

6. The method as claimed in claim 5 further comprising the step of forming a contact window through said oxide layer and said spin-on-glass layer.

7. The method as claimed in claim 6 further comprising the step of forming a second metal layer over said oxide layer for contacting said first metal layer through said contact window.

8. The method as claimed in claim 1 further comprising the step of etching said spin-on-glass layer.

9. The method as claimed in claim 1, wherein said pre-processing step is performed for approximately five to fifteen seconds.

10. The method as claimed in claim 1, wherein said impurities comprise organic content or moisture.

* * * * *